United States Patent [19]
Bhatt et al.

[11] Patent Number: 6,039,186
[45] Date of Patent: Mar. 21, 2000

[54] COMPOSITE TRANSPORT CARRIER

[75] Inventors: Sanjiv M. Bhatt, Minnetonka; Shawn D. Eggum, Victoria; Wayne C. Olson, Eden Prairie, all of Minn.

[73] Assignee: Fluoroware, Inc., Chaska, Minn.

[21] Appl. No.: 09/058,137

[22] Filed: Apr. 10, 1998

Related U.S. Application Data

[63] Continuation-in-part of application No. 08/843,464, Apr. 16, 1997, abandoned.

[51] Int. Cl.⁷ .................................................... B65D 85/90
[52] U.S. Cl. .......................... 206/711; 206/454; 206/832; 211/41.18
[58] Field of Search ............................ 118/500; 206/454, 206/710, 711, 832, 833; 211/41.18

[56] References Cited

U.S. PATENT DOCUMENTS

| | | |
|---|---|---|
| D. 292,743 | 11/1987 | Hung . |
| 3,486,631 | 12/1969 | Rodman . |
| 3,682,083 | 8/1972 | Puente . |
| 3,877,134 | 4/1975 | Shanahan . |
| 3,949,891 | 4/1976 | Butler et al. . |
| 4,471,716 | 9/1984 | Milliren . |
| 4,527,222 | 7/1985 | Swingley, Jr. . |
| 4,574,950 | 3/1986 | Koe et al. . |
| 5,025,924 | 6/1991 | Watanabe . |
| 5,042,671 | 8/1991 | Bischoff et al. . |
| 5,110,001 | 5/1992 | Dunn . |
| 5,111,936 | 5/1992 | Kos . |
| 5,253,755 | 10/1993 | Maenke . |
| 5,390,972 | 2/1995 | Galloway . |
| 5,399,398 | 3/1995 | Toshimitsu et al. . |
| 5,423,422 | 6/1995 | Biore et al. . |
| 5,472,099 | 12/1995 | Terashima . |
| 5,490,011 | 2/1996 | Pernick et al. . |

FOREIGN PATENT DOCUMENTS

| | | |
|---|---|---|
| 0682357A2 | 5/1995 | European Pat. Off. . |
| 2 257 986A | 7/1992 | United Kingdom . |

*Primary Examiner*—Jim Foster
*Attorney, Agent, or Firm*—Douglas J. Christensen

[57] ABSTRACT

A composite wafer carrier for holding and restraining circular semiconductor wafer disks during their transport, storage, and processing. The composite wafer carrier generally comprising an open top and bottom for insertion and removal of wafer disk, an upright front end member having an interface portion such as an H-bar, an upright back end member, and a pair of sidewall members with vertical sidewall slots extending rearwardly from the front end member to said back end member. At least one of said members separately molded and joined to the other members of the wafer carrier by cooperating engagement portions without external fasteners. The wafer carrier may be snapped together. A separate second interface at the back end member may be provided to allow the carrier to interface with equipment with the wafer top side up or inverted. The separately formed members permit different materials to be used or the same basic material with different formulations for example, for differing static dissapative characteristics.

18 Claims, 17 Drawing Sheets

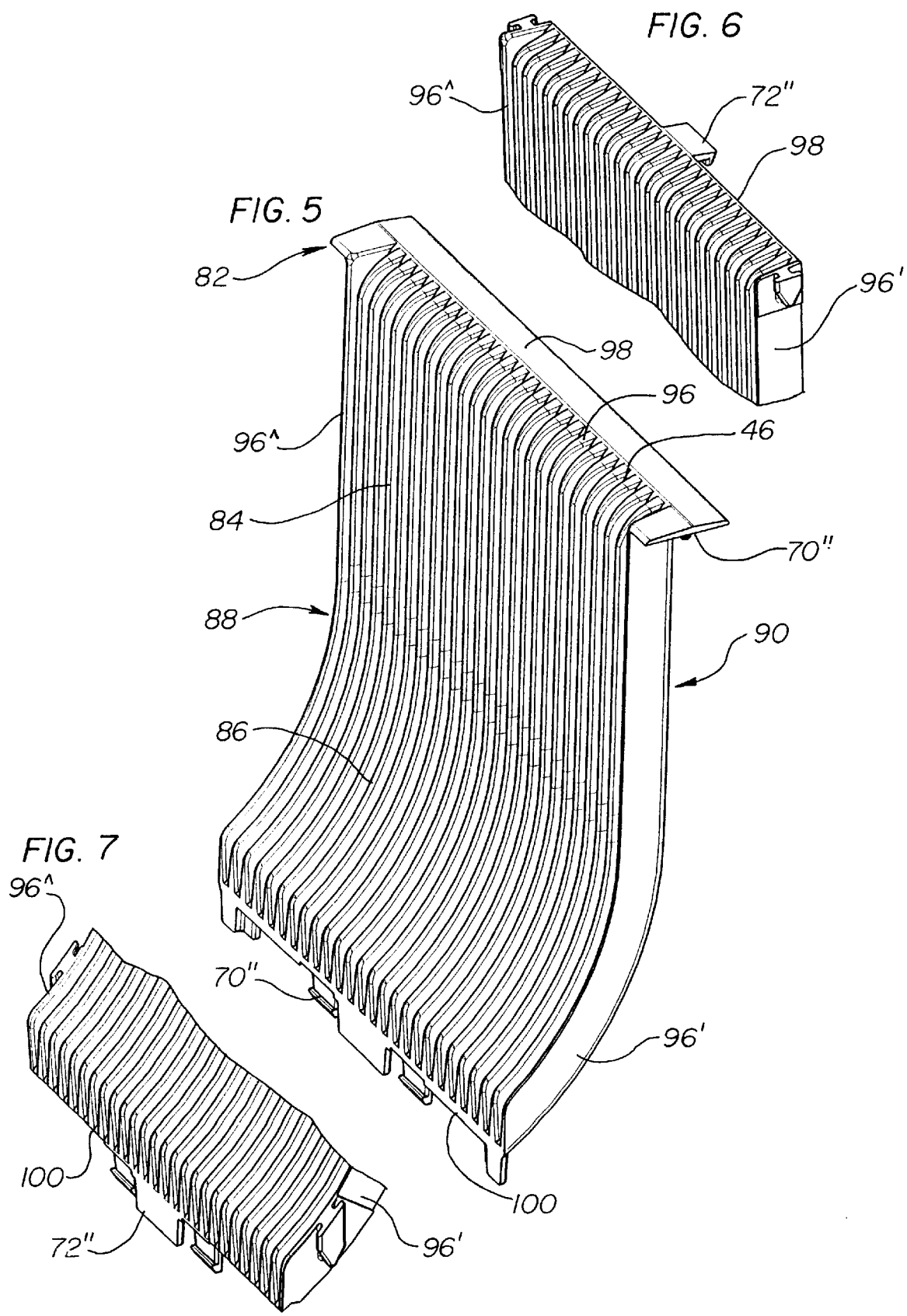

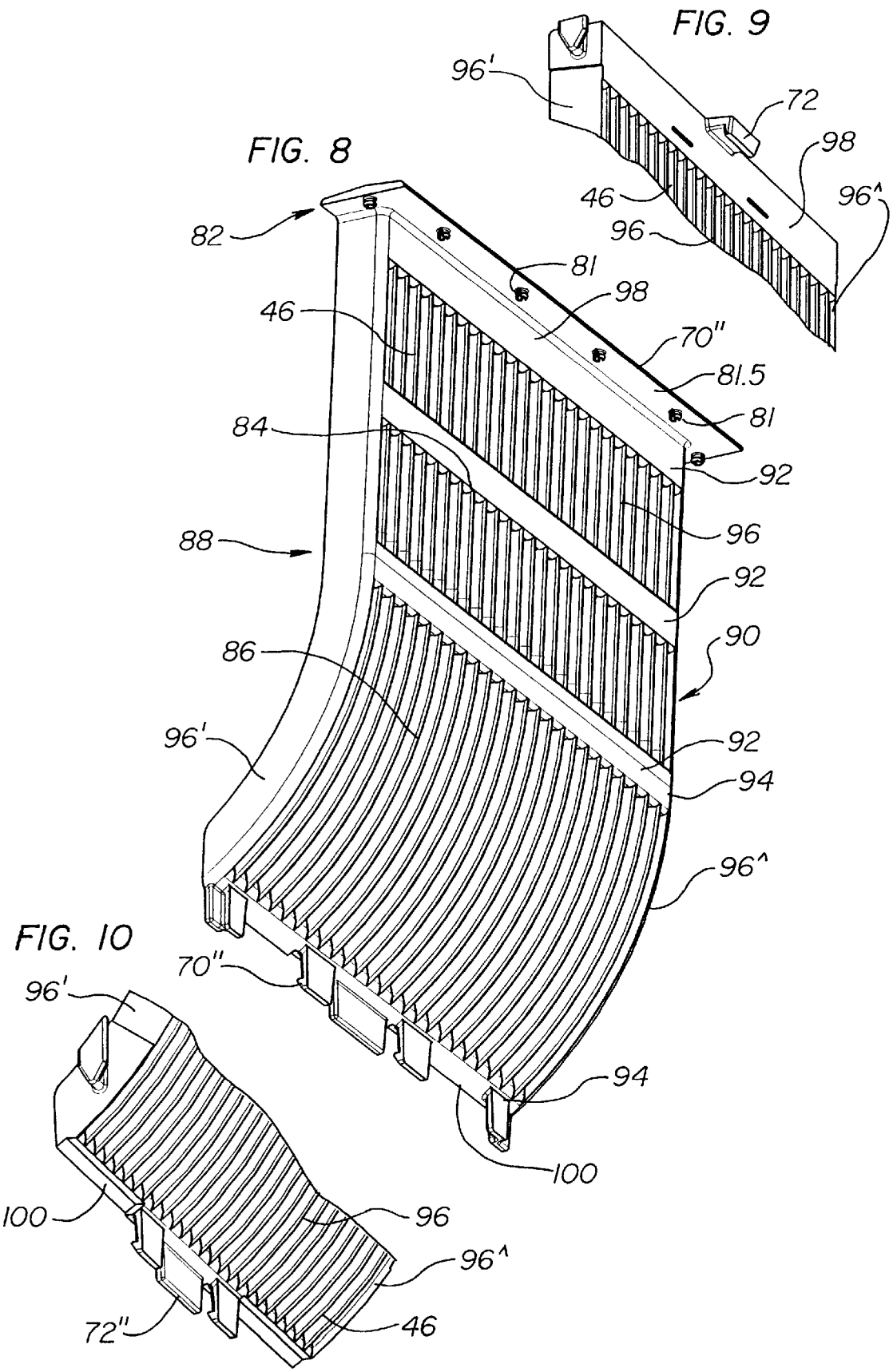

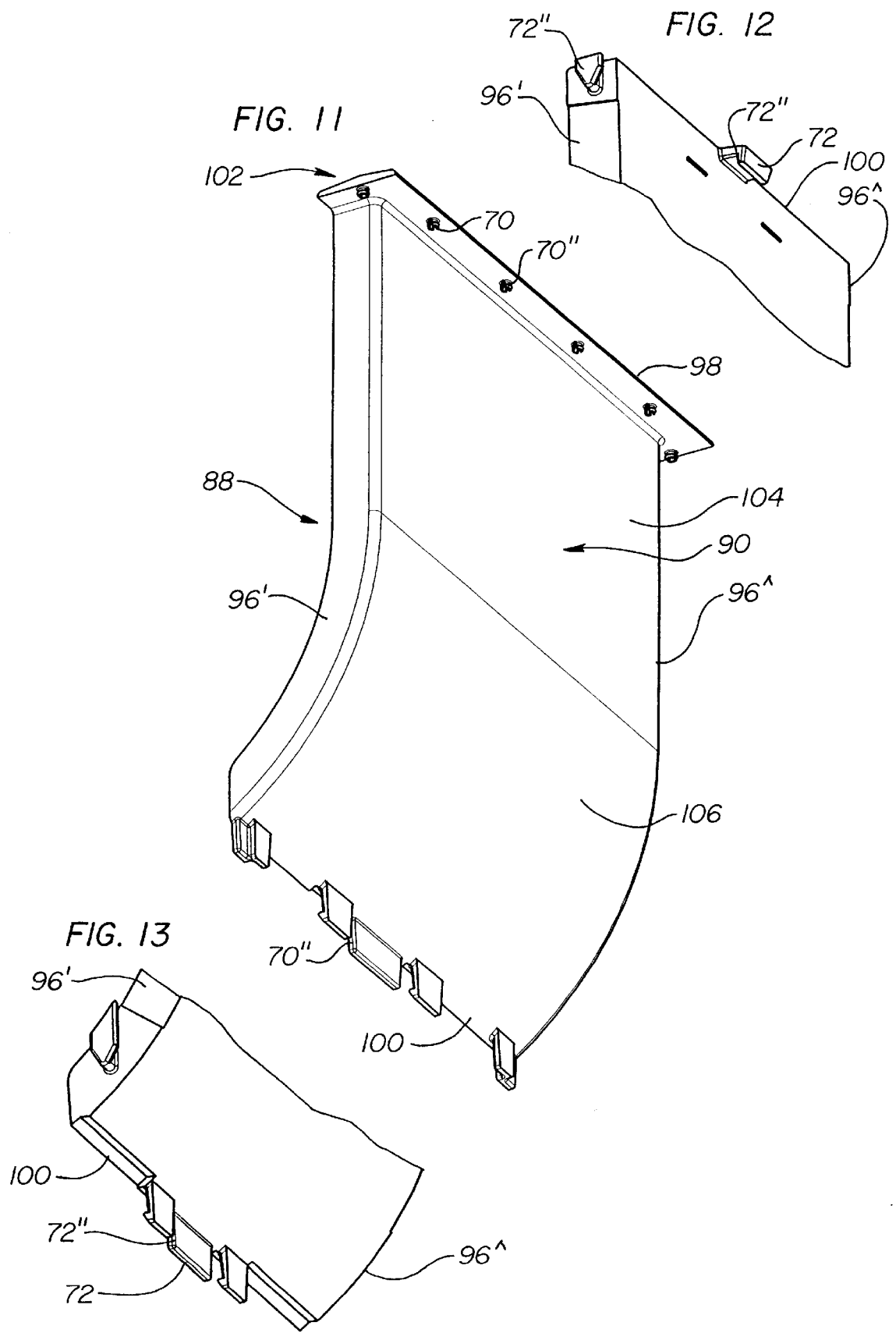

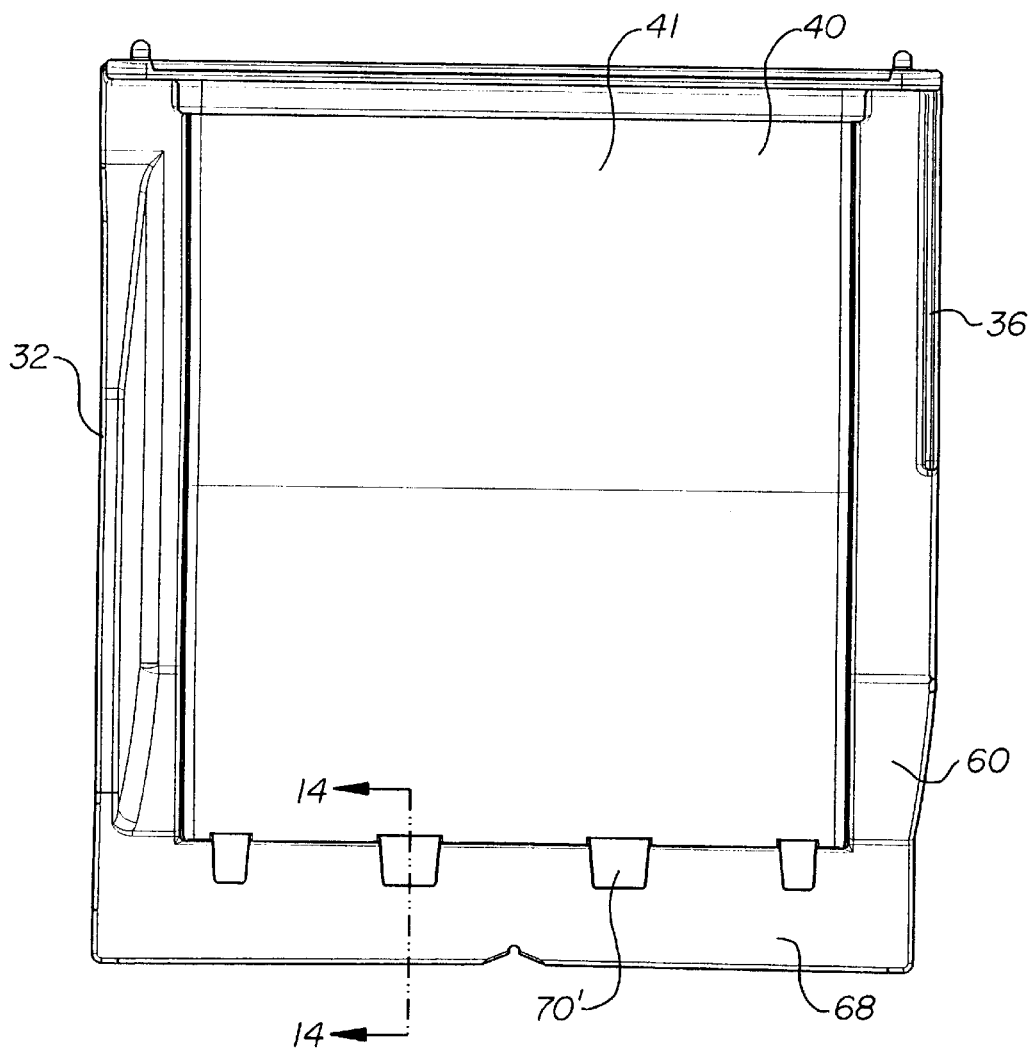
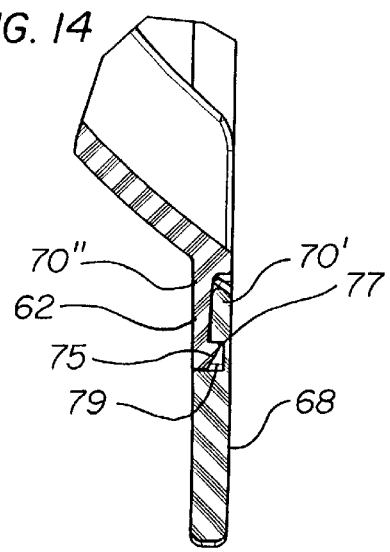

FIG. 28
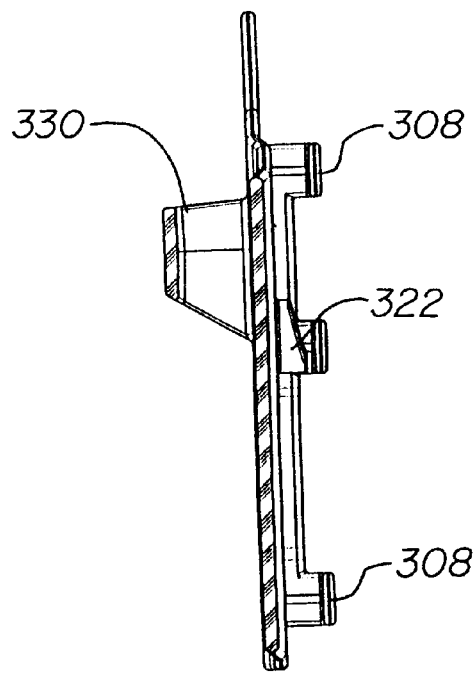
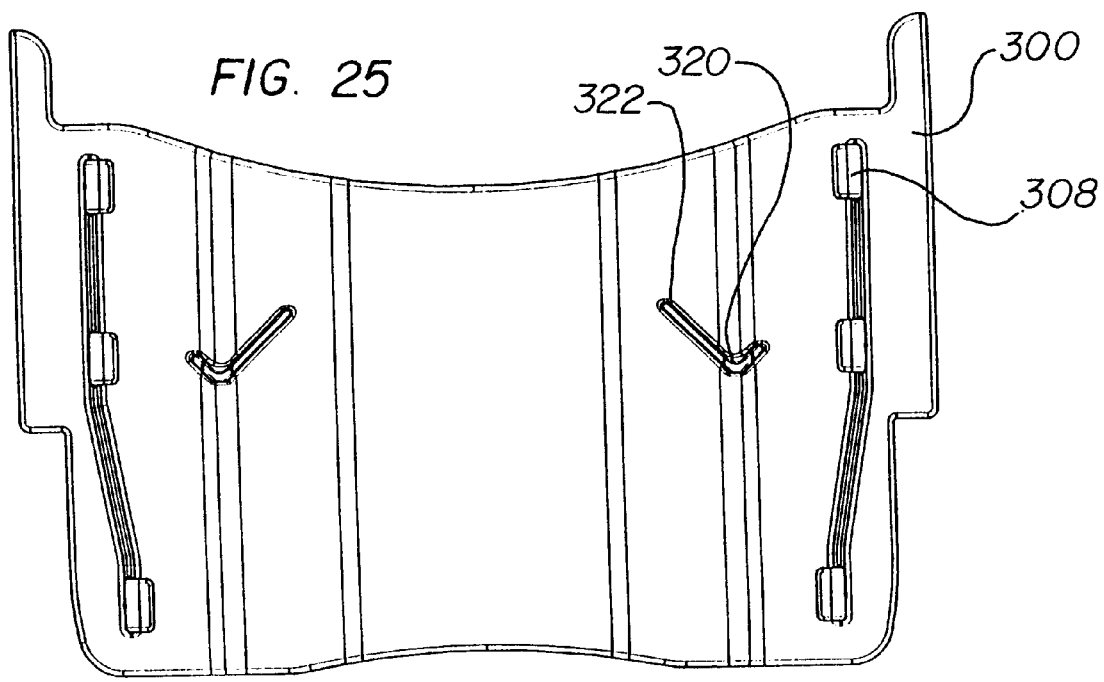
FIG. 25

COMPOSITE TRANSPORT CARRIER

This application is a continuation-in-part application of U.S. application Ser. No. 08/843,464, filed Apr. 16, 1997, now abandoned.

BACKGROUND OF THE INVENTION

This invention relates to a composite wafer carrier designed for the transportation, storage, and processing of semiconductor wafer disks used in the production of integrated circuit components.

The processing of wafer disks into integrated circuit chips often involves several steps where the disks are repeatedly processed, stored and transported. Due to the delicate nature of the disks and their extreme value, it is vital that they are properly protected throughout this procedure. One purpose of a wafer carrier is to provide this protection. Additionally, since the processing of wafer disks is generally automated, it is necessary for disks to be precisely positioned relative to the processing equipment for the robotic removal and insertion of the wafers. A second purpose of a wafer carrier is to is to securely hold the wafer disks during transport.

The conventional wafer carrier is a single molded part generally comprising a front end having an H-bar interface portion, a back end having a panel, and sidewalls having slots and lower curved or converging portions following the curvature of the wafers, and with an open top and open bottom. These designs present problems in both their versatility and manufacture. When an adjustment needs to be made to a single-mold carrier's specifications the old mold or a portion thereof is typically modified or scrapped and a new mold or portion thereof tooled. The individual unchanged portions of the carrier typically cannot be separately molded and stockpiled for future assembly. Additionally, larger volume and more complex molded parts increase the possibility that warping or other structural problems will occur, thus affecting product quality and consistency. Consequently, single-mold integral wafer carriers have inherent inefficiencies.

Specifications which may be desirable to change on wafer carriers include the type of plastic, equipment interfaces, static dissapative characteristics, and wafer positioning and spacing.

SUMMARY OF THE INVENTION

The present invention utilizes separately molded parts to form a composite H-bar wafer carrier. This design reduces the structural and versatility problems associated with single-mold H-bar carriers. First, by reducing the volumetric size of the molded part, structural problems such as warping are reduced, thus increasing the quality, accuracy, and consistency of wafer carrier manufacture. Furthermore, this design increases versatility by allowing various specifications to be met simply by re-designing the sidewalls or other components rather than the entire wafer carrier. As a result, the present invention is much more efficient than previous single-mold designs.

One embodiment of the present invention is an H-bar wafer carrier which utilizes separately molded wafer engaging sidewalls inserted into a molded wafer carrier frame. The wafer carrier frame having a front end member, an opposite back end member, and side support members or spanning members extending between the front member end and the back end members providing securing means for retaining the sidewalls in place. The sidewalls each have a plurality of slots for holding and restraining wafers in the carrier during transport or storage. The front end member has an H-bar for interfacing with processing equipment to assure precise alignment for robotic insertion and removal of wafer disks. Additionally, a second equipment interface may be positioned at the back end member.

A feature of the invention is to increase wafer carrier manufacturing efficiency. Rather than having to design an entire wafer carrier and tool a new mold, a specification for a wafer carrier can often be met simply by designing new sidewalls and inserting them into a universal wafer carrier frame.

Another feature of the invention is to substantially increase wafer carrier versatility to reduce cost and material waste. More expensive materials, such as polyetheretherketone (PEEK), ideally suited for portions of the carrier which engage the waters can be limited to the sidewalls with other conventional materials, such as polypropylene (PP), polybutylene terephthalate (PBT), and polytetratluoroethylene (PTFE) can be utilized for the carrier frame. Similarly, rather than scrapping an entire wafer carrier once a set of specifications have been discontinued, the sidewalls may be redesigned to meet the new specifications without altering the carrier framework mold.

Another feature of the invention is to provide greater assurance of consistent quality from carrier to carrier by significantly reducing warpage and other problems associated with wafer carriers made from a single mold.

Another feature of the invention is to provide greater flexibility in testing new sidewall materials and designs. Testing can be accomplished simply by exchanging sidewalls rather than remolding an entire wafer carrier.

Another feature of the invention is to increase the structural precision of wafer carriers. By molding the sidewalls separately, manufacturers can more accurately and consistently satisfy requested specifications.

Another feature of the invention, for certain embodiments, is to provide greater ease in repairing wafer carriers. A wafer carrier could be repaired or rebuilt by replacing the sidewalls or other portions.

Another feature of the invention is that sidewall inserts are much more easily molded with minimal warpage. Where there is some warpage in the carrier framework, such as in the framework surrounding sidewall insert opening, the structural support provided by the sidewall inserts may correct said warpage insertion.

Another feature of the invention is that additional machine interfaces or flanges with handles may be attached and changed to the back end of the wafer carrier. With a second opposite machine interface the wafer carrier can be placed on equipment for retrieval of wafers with the wafers either with their top side up or inverted.

Another feature and advantage of the invention in preferred embodiments is that the assembled wafer carrier has only point or line contact at the junctures of the separate components. Additionally, no external fasteners are needed for assembly of the carriers.

BRIEF DESCRIPTION OF THE DRAWINGS

FIG. 5 is a perspective view of a sidewall according to one preferred embodiment of the invention.

FIG. 6 is a perspective front-side view of the top portion of a sidewall according to another preferred embodiment of the invention.

FIG. 7 is a perspective front-side view of the bottom portion of a sidewall according to another preferred embodiment of the invention.

FIG. 8 is a perspective view of a sidewall according to one preferred embodiment of the invention.

FIG. 9 is a perspective back-side view of the top portion of a sidewall according to another preferred embodiment of the invention.

FIG. 10 is a perspective view of the bottom portion of a sidewall according to another preferred embodiment of the invention.

FIG. 11 is a perspective view of a sidewall according to one preferred embodiment of the invention.

FIG. 12 is a perspective back-side view of the top portion of a sidewall according to one preferred embodiment of the invention.

FIG. 13 is a perspective back-side view of the bottom portion of a sidewall according to one preferred embodiment of the invention.

FIG. 14 is a cross sectional view at line 14—14 of FIG. 15.

FIG. 15 is a side elevational view of an assembled composite wafer carrier.

FIG. 25 is a front elevational view of a second equipment interface.

FIG. 28 is a cross-sectional view thru line 28—28 of FIG. 26.

DETAILED SPECIFICATION OF THE PREFERRED EMBODIMENTS

Figure 1:
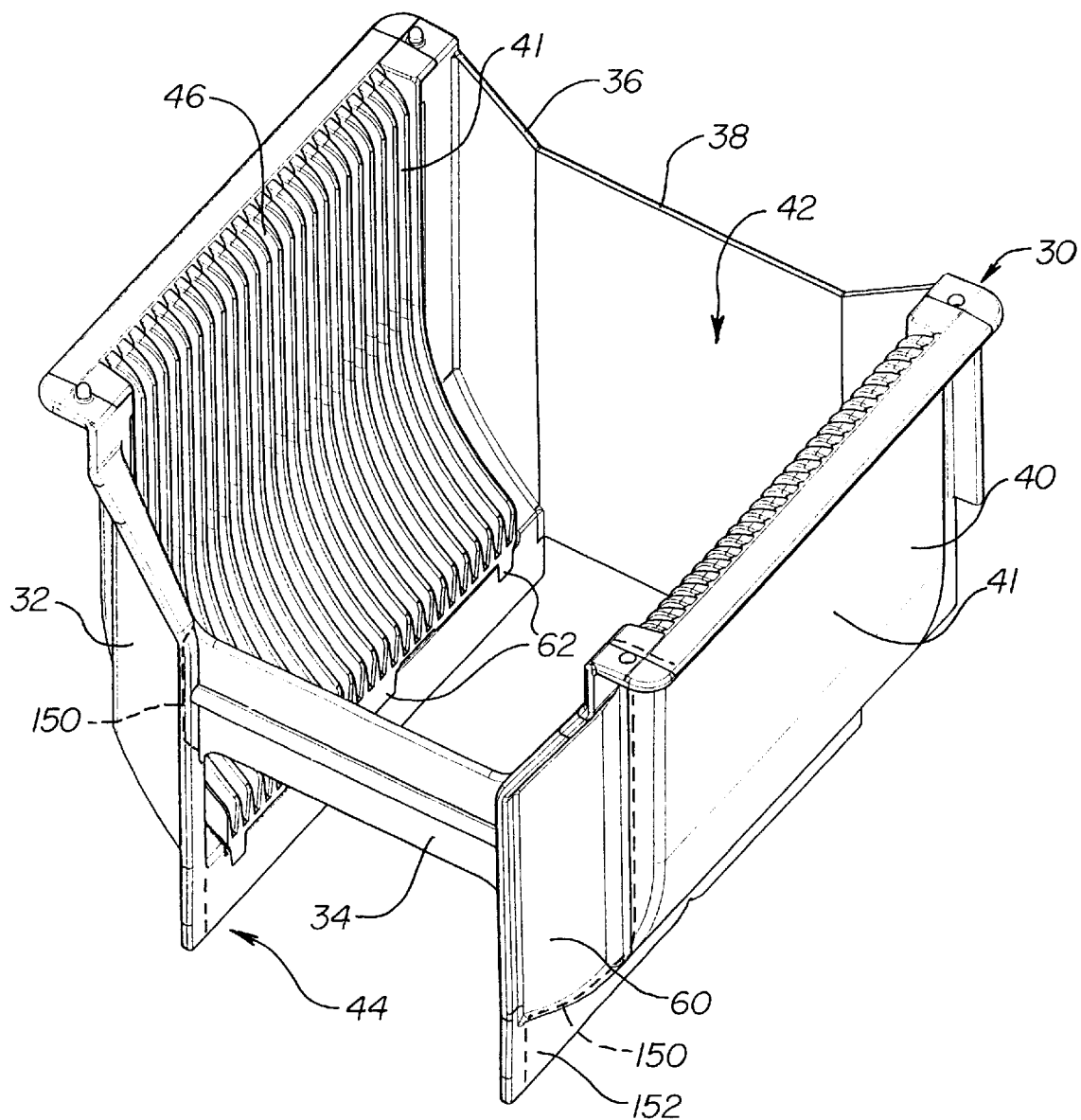
FIG. 1 is a perspective view of an assembled composite wafer carrier.
Figure 2:
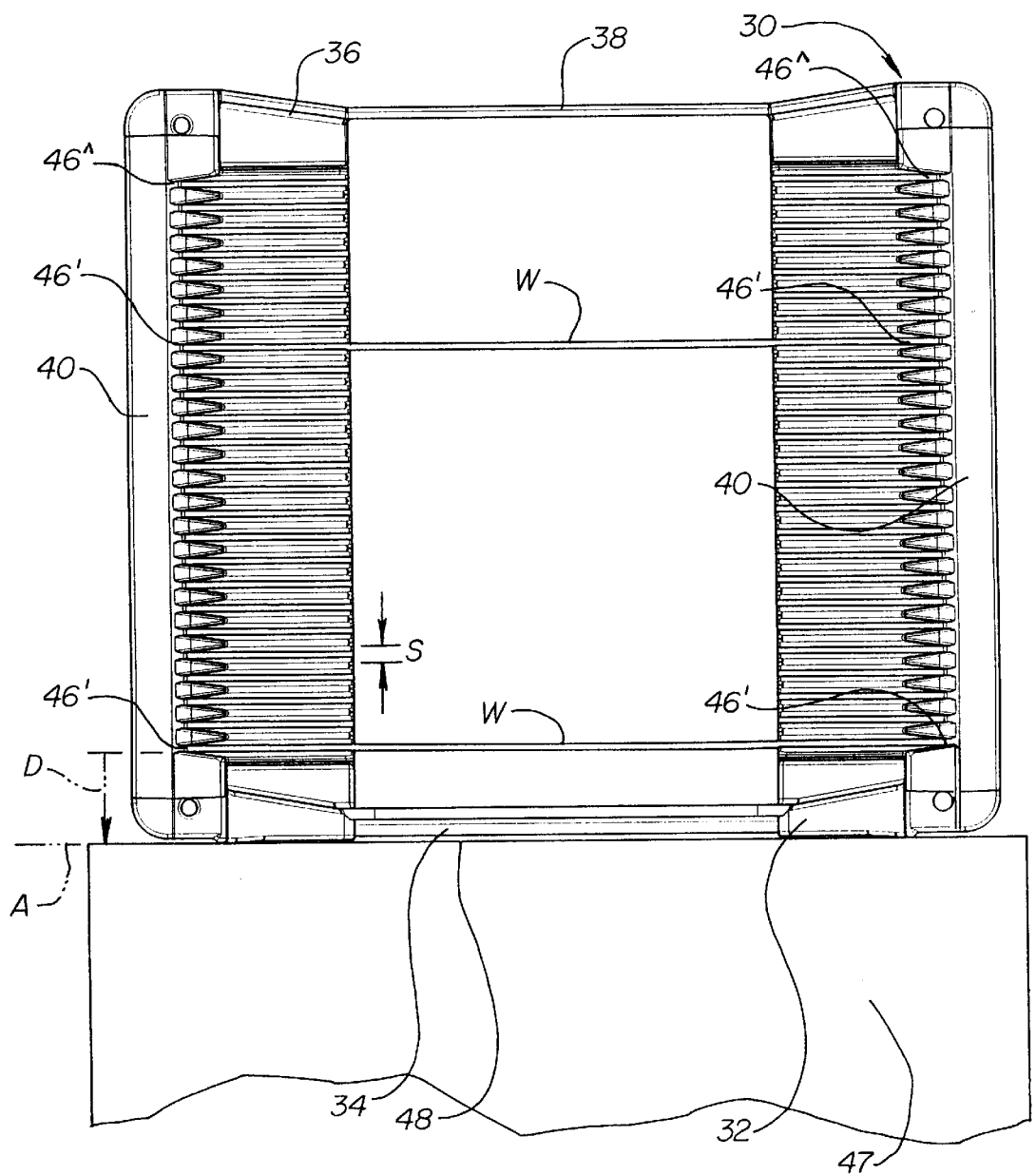
FIG. 2 is an elevational view of a wafer carrier with its first end interfaced with processing equipment.

Referring to FIGS. 1 and 2, an example of a composite wafer carrier is shown, generally designated 30, for transporting and storing circular semiconductor wafer disks W. The apparatus 30 has several conventional features which principally includes a first or H-bar upright front end member 32 having an equipment interface portion 34, a second or upright back end member 36 having an intermediate section configured as a panel 38, and sidewalls 40 with slots 46 for holding the wafers W. The slots 46 are suitable for holding and restraining wafer disks W during the storage, transport, and robotic handling of the composite wafer carrier 30. The carrier 30 has an open top 42 for receiving wafers and an open bottom 44.

FIG. 2 shows the composite wafer carrier 30 interfaced with processing equipment 47. The wafer disks W are inserted into first position slot $46^I$ and slot $46^i$ of sidewalls 40. The number of slots n, slot spacing s, location d of first position slot $46^I$ with respect to the datum plane A, and last slot position $46^n$ of sidewalls 40, must accommodate the requirements of the processing equipment 47 and processing equipment interface 48.

Referring again to FIGS. 1 and 2, the wafer carrier 30 also comprises an universal carrier framework 60 which integrates with sidewall inserts 41, and securing means generally designated 62 to lockingly engage the sidewall inserts 41 in the framework 60. Universal carrier framework 60 is preferably made of injection molded plastics, for example polypropolene commonly used and known throughout the industry for wafer carriers. Sidewall inserts 41, may be made of a different material than that used to create universal carrier framework 60. Accordingly, the composite wafer carrier 30 can be made to accommodate various types of processing equipment requiring different first slot positions $46^I$, number of slots n, and slot spacing s, simply by utilizing appropriate sidewall inserts meeting the appropriate specifications. Various combinations of sidewall inserts, carrier framework configurations, and securing means embodiments can be used to form the composite wafer carrier 30.

Figure 3:
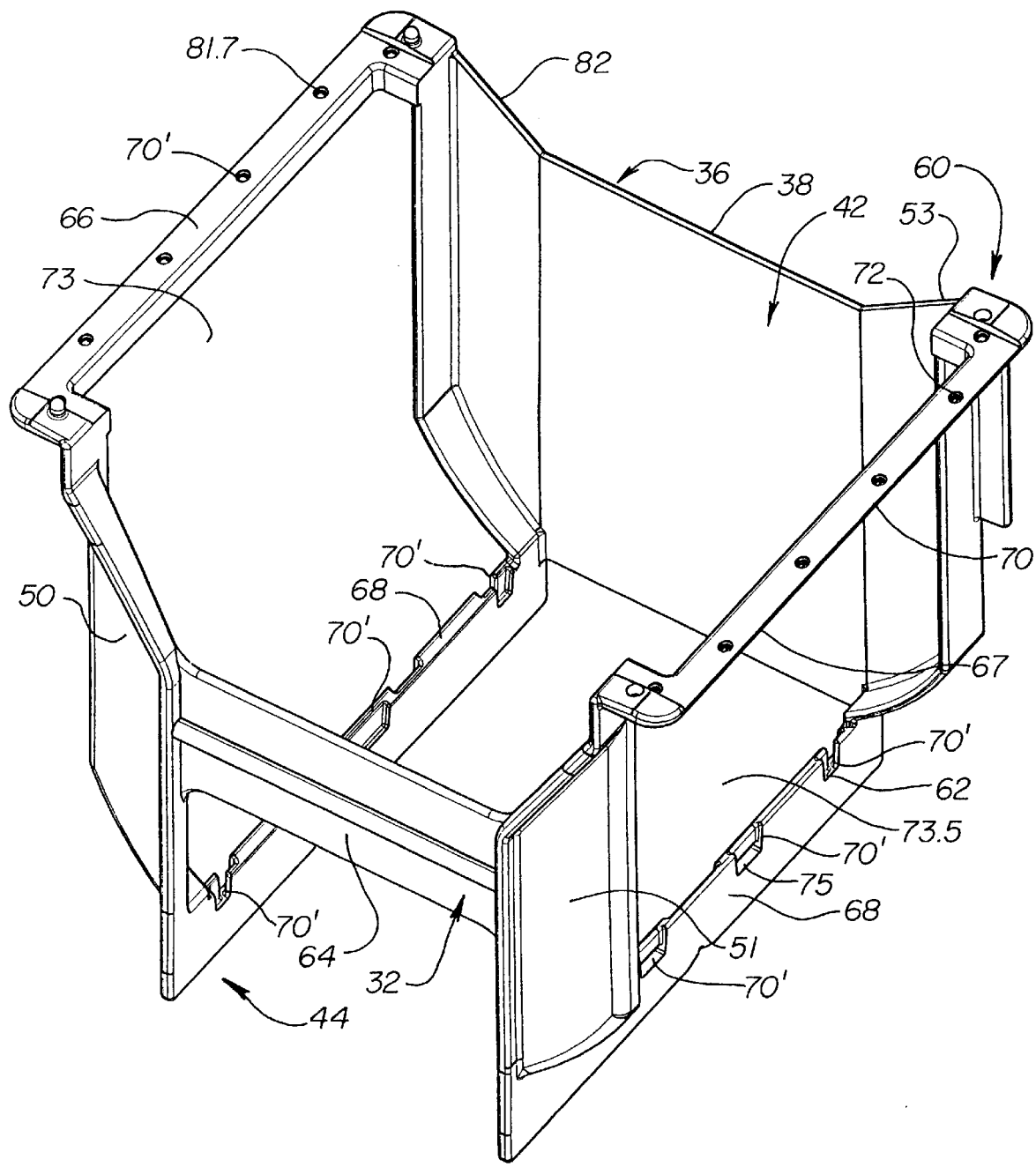
FIG. 3 is a perspective view of a universal wafer carrier framework according to the invention.

Referring to FIG. 3, the universal carrier framework 60 is shown corresponding to the complete carrier shown in FIG. 1. The framework 60 includes the front end member 32 having H-bar 64, the back end member 36 having end panel 38, first and second upper side supports 66, 67, first and second lower side supports 68, 69, open top 42, and open bottom 44. Framework engagement portions, generally designated 70' of securing means 62 are configured as slots. H-bar 64 is used to interface processing equipment. Upper side supports 66, 67 extend from the left portion 50 and right portion 51 of front end 32 to the left portion 52 and right portion 53 of back end 36. The lower side supports 68, 69 also extend from the left and right portions 50, 51 of front end 32 to the left and right portions 52, 53 of back end 36. The side supports 66, 67, 68, 69 span the distance between the front end member and the back end member 36 and define generally rectangular closed sidewall insert openings configured as a first and second window 73, 73.5. The sidewall inserts 82, 102 corresponding to the framework 60 and securing means 62 of FIG. 3 are shown in FIGS. 5, 8 and 11 and are discussed in detail below.

Referring to FIGS. 14 and 15 details of the securing means 62 at the lower side support 68 are shown. Framework engagement portions 70' and cooperating sidewall engagement portions 70" of securing means 62 comprise a plurality of cooperating engagement portions to facilitate coupling the respective framework 60 and sidewall inserts 41. FIG. 14, a cross-sectional view of FIG. 15, shows one part of framework engagement portion 70' cooperatively engaging the sidewall engagement portions 70". In this embodiment, framework engagement portions 70' and sidewall engagement portions 70" of securing means 62 comprise a snap-in locking tab 75, and recess 77, and detente 79 for a secure mechanical connection to lockingly engage the respective framework and sidewall engagement portions at each securing means location.

Referring to FIGS. 3 and 8, the securing means 62 of the embodiment of FIG. 1 also includes a plurality of downwardly extending nubs 81 from upper horizontal coupling panels 81.5 of the sidewall inserts 82. The nubs 81 engage into recess 81.7 in the upper side supports 66, 67. The recesses may be indentations or holes through said side supports 66, 67. In this embodiment the upper horizontal coupling panels 81.5 extend over the side supports while the tabs 70" extending from the lower portions of the sidewall inserts lock into the recesses 77 in the lower side supports 68, 69. The locking engagement in conjunction with the positioning of the sidewall inserts in the sidewall windows provide a rigid composite structure.

Figure 4:
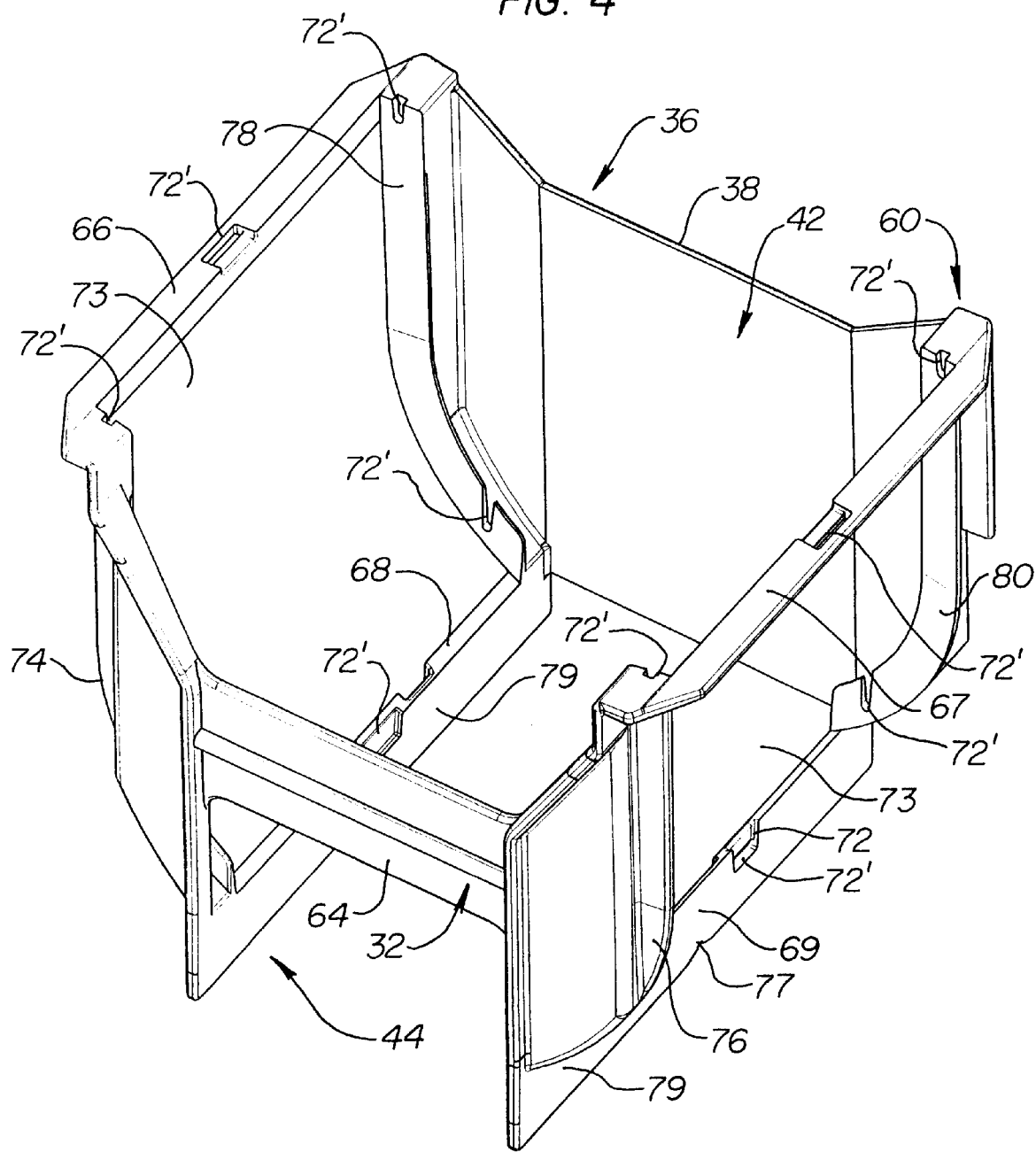
FIG. 4 is a perspective view of another universal wafer carrier framework according to the invention.
Figure 17:
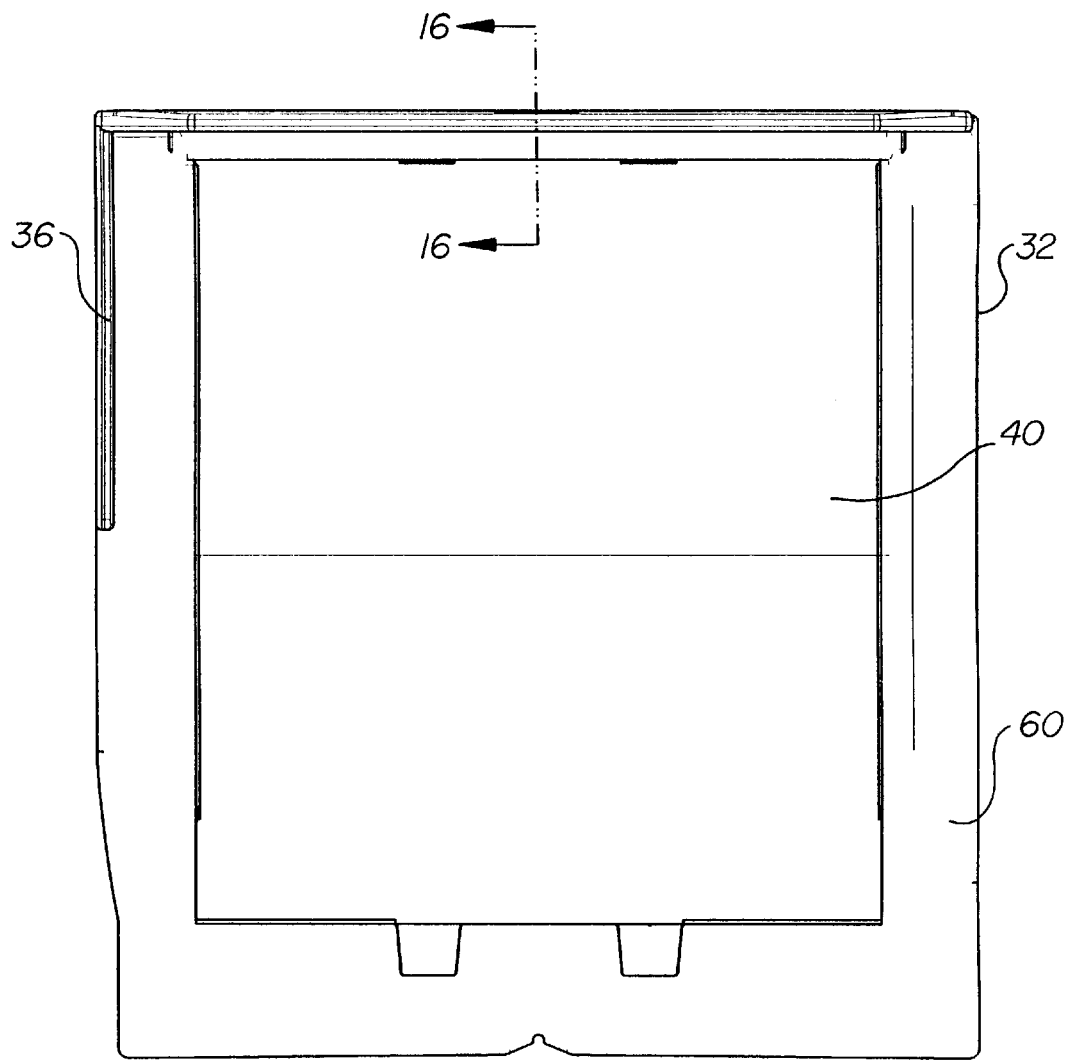
FIG. 17 is a side elevational view of an assembled composite wafer carrier.
Figure 16:
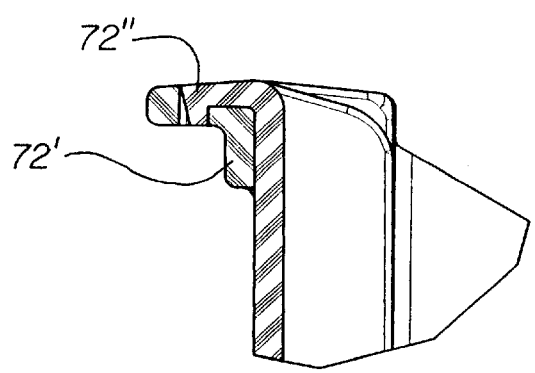
FIG. 16 is a cross sectional view of line 16—16 of FIG. 17.

FIG. 4 shows a universal carrier framework 60 having framework engagement portions 12 with an alternate securing means 72. Referring to FIGS. 6, 7, 9, 10, 12, 13, portions of sidewall inserts suitable for the framework 60 of FIG. 4 are shown. The sidewall inserts have slots 46, teeth 96, an upper portion 84, lower curved portion 86, upper supports 92, lower supports 94, and sidewall engagement members, generally designated 70" of securing means 62. Sidewall engagement members 70" are positioned about top 98 and bottom 100 of sidewall 82.

The slots 46 are formed between elongated teeth 96 running parallel to each other. Sidewall boundaries are defined by first side tooth $96^I$ and nth sidetooth $96^n$, top side 98, and bottom side 100. Disks inserted into slots 46 are held securely during transport, robotic handling, and storage. The number n and spacing s of slots 46 and the location of first position slot $46^I$ can be adjusted according to disk type and processing equipment being used.

Elongated teeth 96 are vertically positioned in upper portion 84 and generally curve inwardly in lower portion 86. One preferred embodiment of the lower portion 86 is the generally curved profile, as shown in FIGS. 5, 8 and 11, to conform to the perimeter of the disks. Upper supports 92 and lower supports 94 hold elongated teeth 96 in position in the embodiments with wash slots 93 and are situated to allow fluid to pass between in side 88 and out side 90.

FIGS. 5 and 11 show inside 88 and outside 90, respectively, of sidewall insert 102, another embodiment of sidewall insert 41. Sidewall insert 102 is identical to sidewall embodiment 82, shown in FIG. 8, except for solid upper planar section 104 and solid lower curved section 108 located on back side 90 which replace upper and lower supports 92 and 94, respectively. Upper planar section 104 and lower curved section 106 secure elongated teeth 96 and close the wash slots 43 preventing the passage of fluid between inside 88 and outside 90.

FIG. 11 shows sidewall 102 with sidewall engagement portions 70" of securing means 70. FIGS. 12 and 13 show sidewall 102 with sidewall engagement portions 72" of securing means 72.

Figure 24:
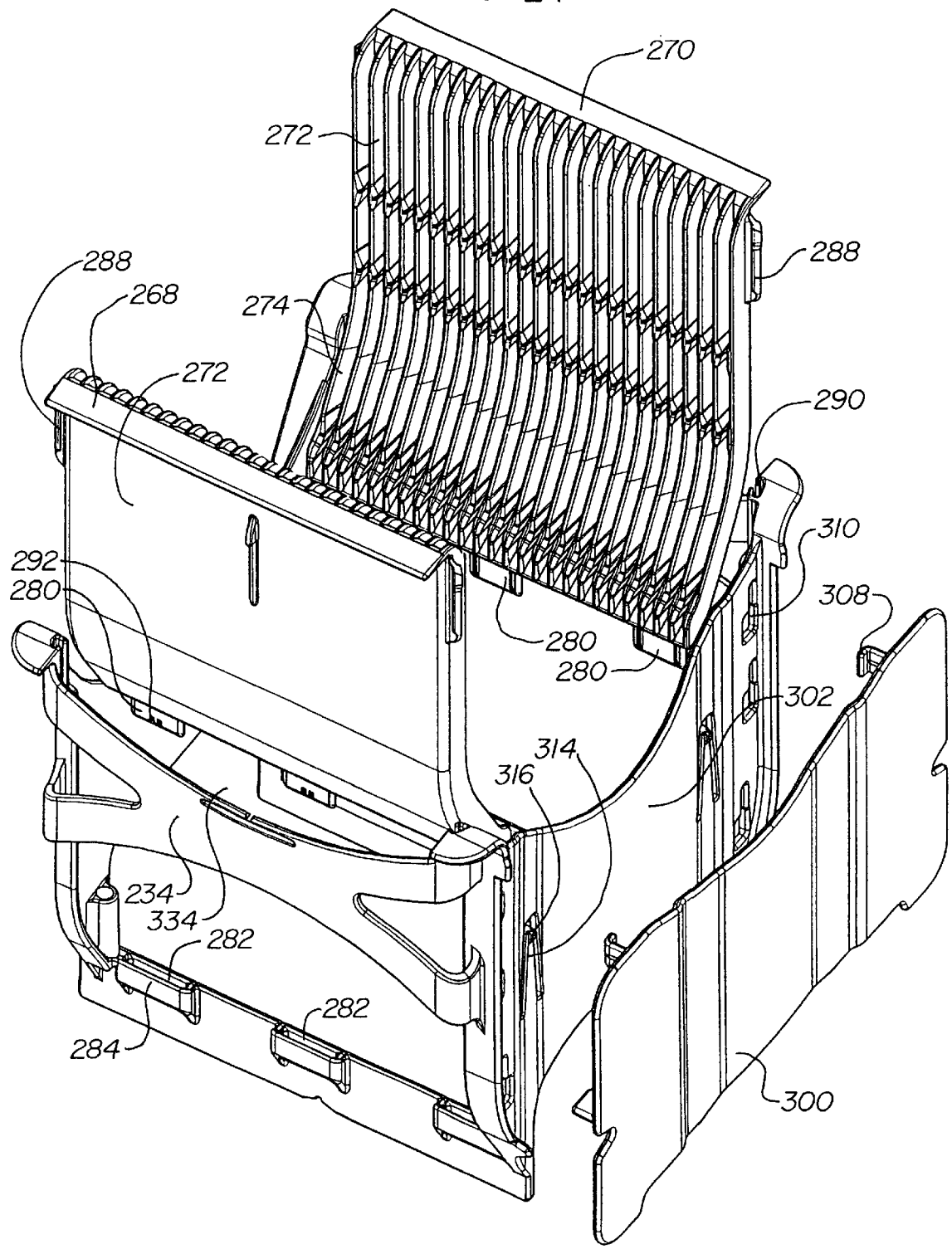
FIG. 24 is a exploded view of the embodiment of FIG. 23.

Other embodiments of universal carrier framework may have one or the other of the upper supports 66 and lower supports 68 of universal framework 60 and using securing means 70 or 72 such as shown in FIG. 24. Sidewalls 82 are configured to fit the carrier framework by utilizing appropriate corresponding securing means to lockingly engage the sidewall inserts in the framework.

Figure 18:
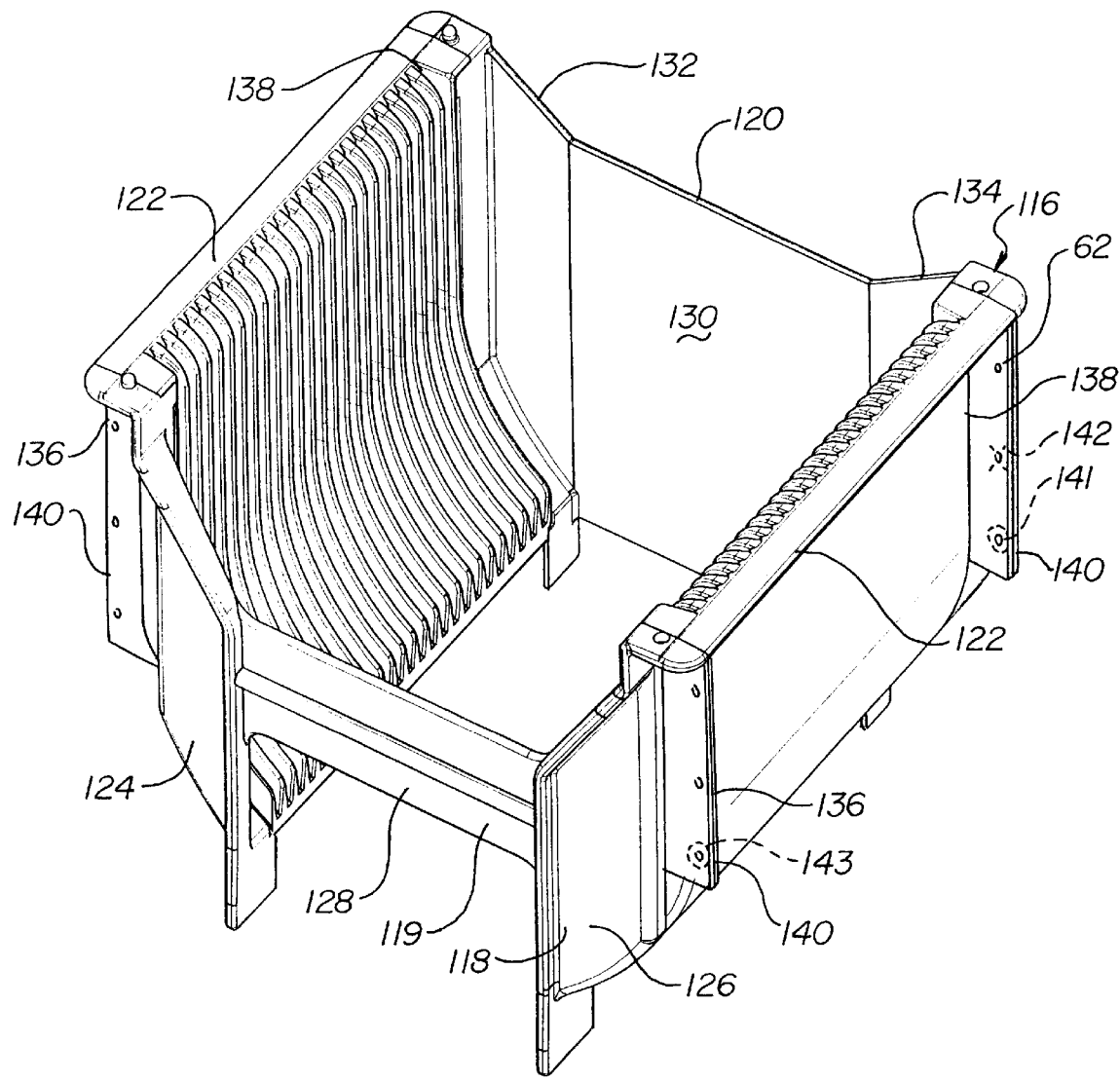
FIG. 18 is a perspective view of an assembled composite wafer carrier according to one preferred embodiment of the invention.
Figure 19:
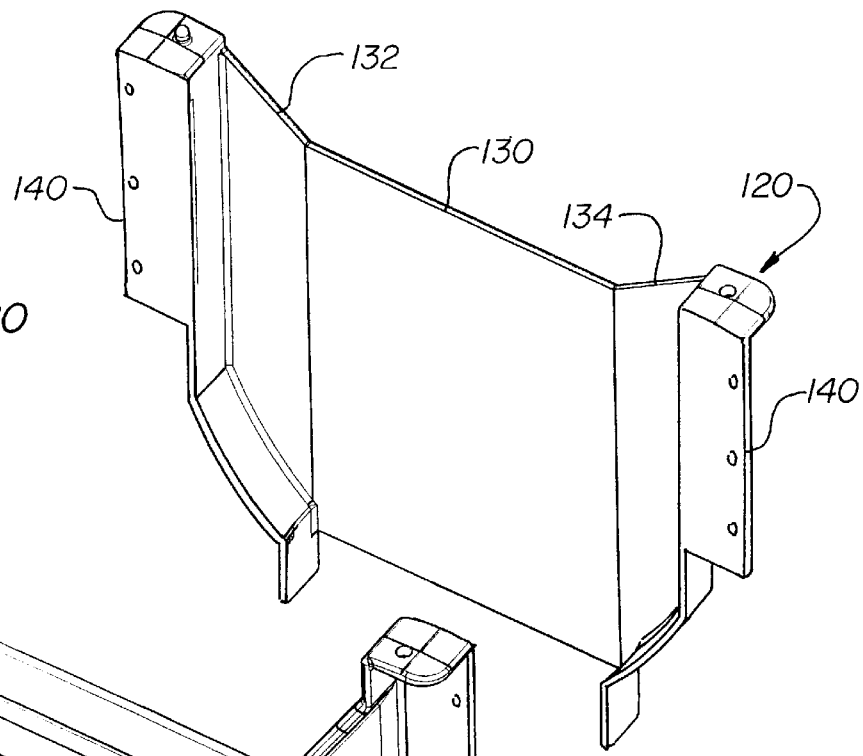
FIG. 19 is a perspective view of a back end member.
Figure 20:
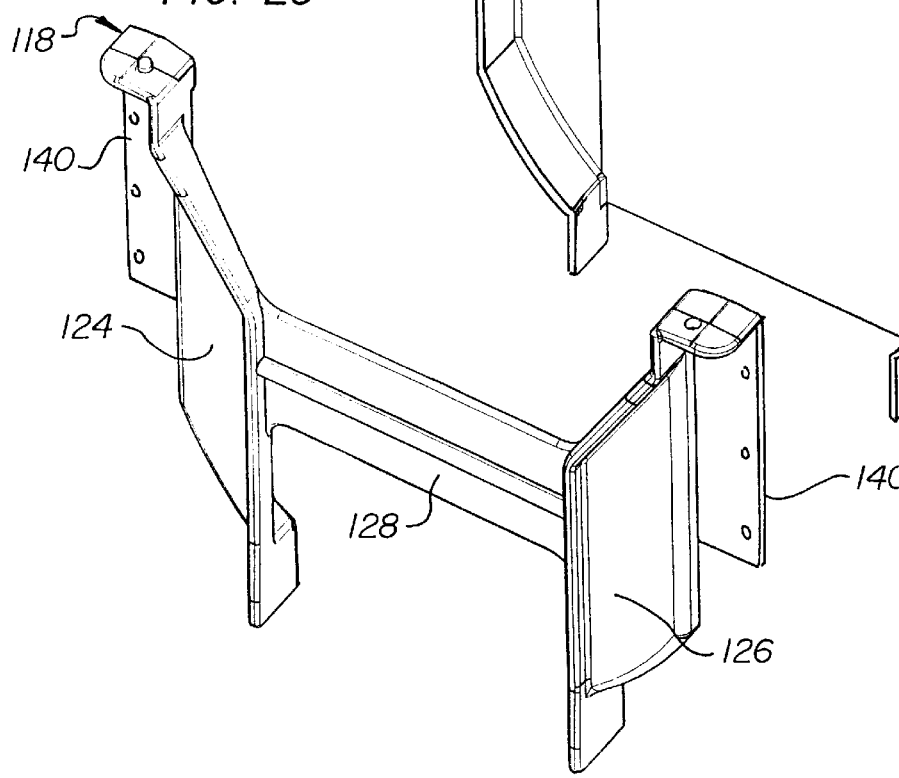
FIG. 20 is a perspective view of the front end member.
Figure 21:
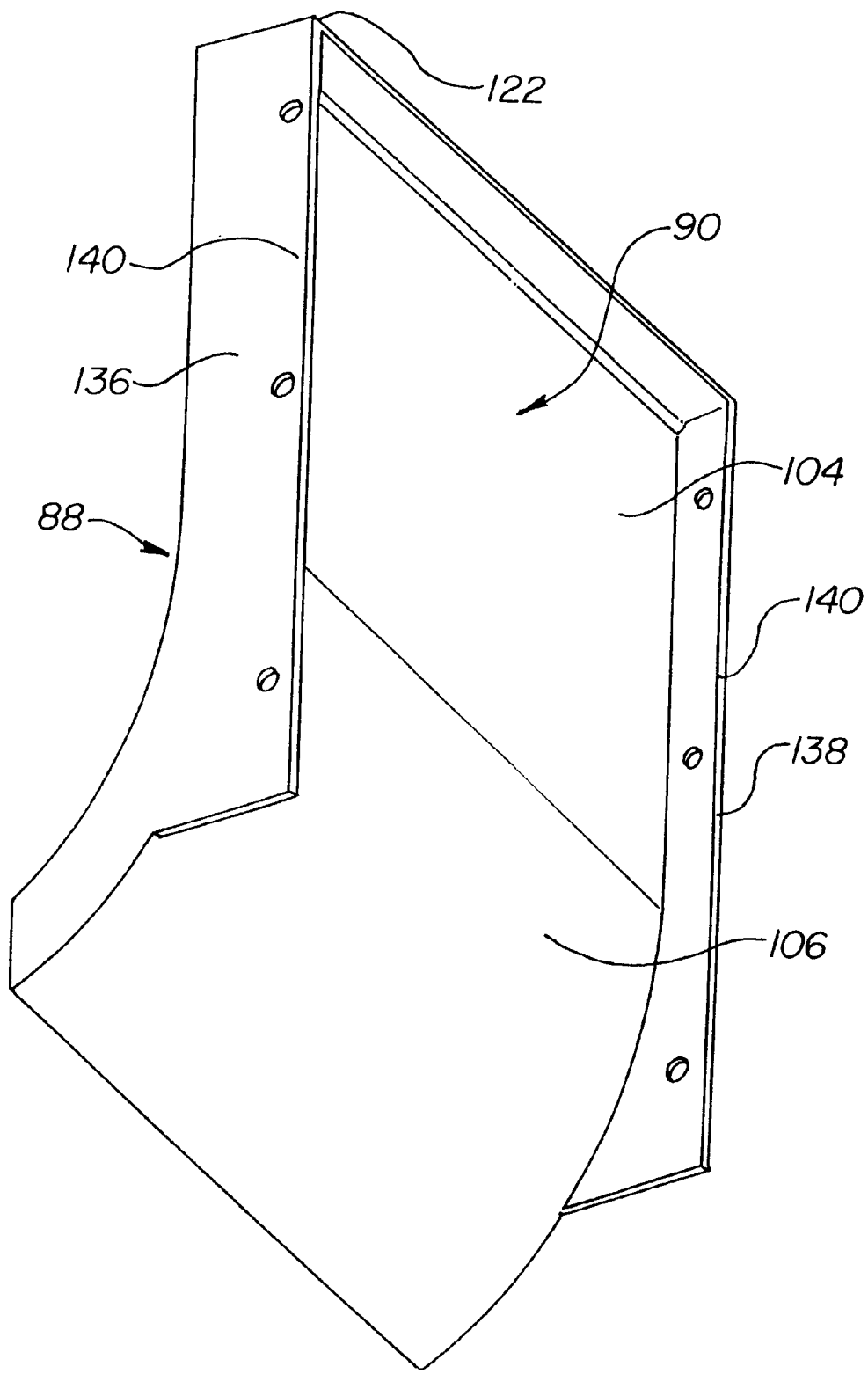
FIG. 21 is a perspective view of a sidewall.

Another embodiment of the composite wafer carrier 116, is shown in FIG. 18 with the corresponding front end member 118, back end member 120 and side wall inserts 122 shown in FIGS. 20, 19, and 21 respectively. In this embodiment the wafer carrier 116 has the following separately molded parts: H-bar front end member 118; back end 120; a mirror image pair of sidewall inserts 122. Front end member 118 has equipment interface portion 119 positioned intermediate left front portion 124 and right front portion 126. Interface portion 119 comprises H-bar 128 and 20. The back end member 120 having end panel 130 positioned intermediate left back end portion 132 and right back end portion 134.

Figure 22:
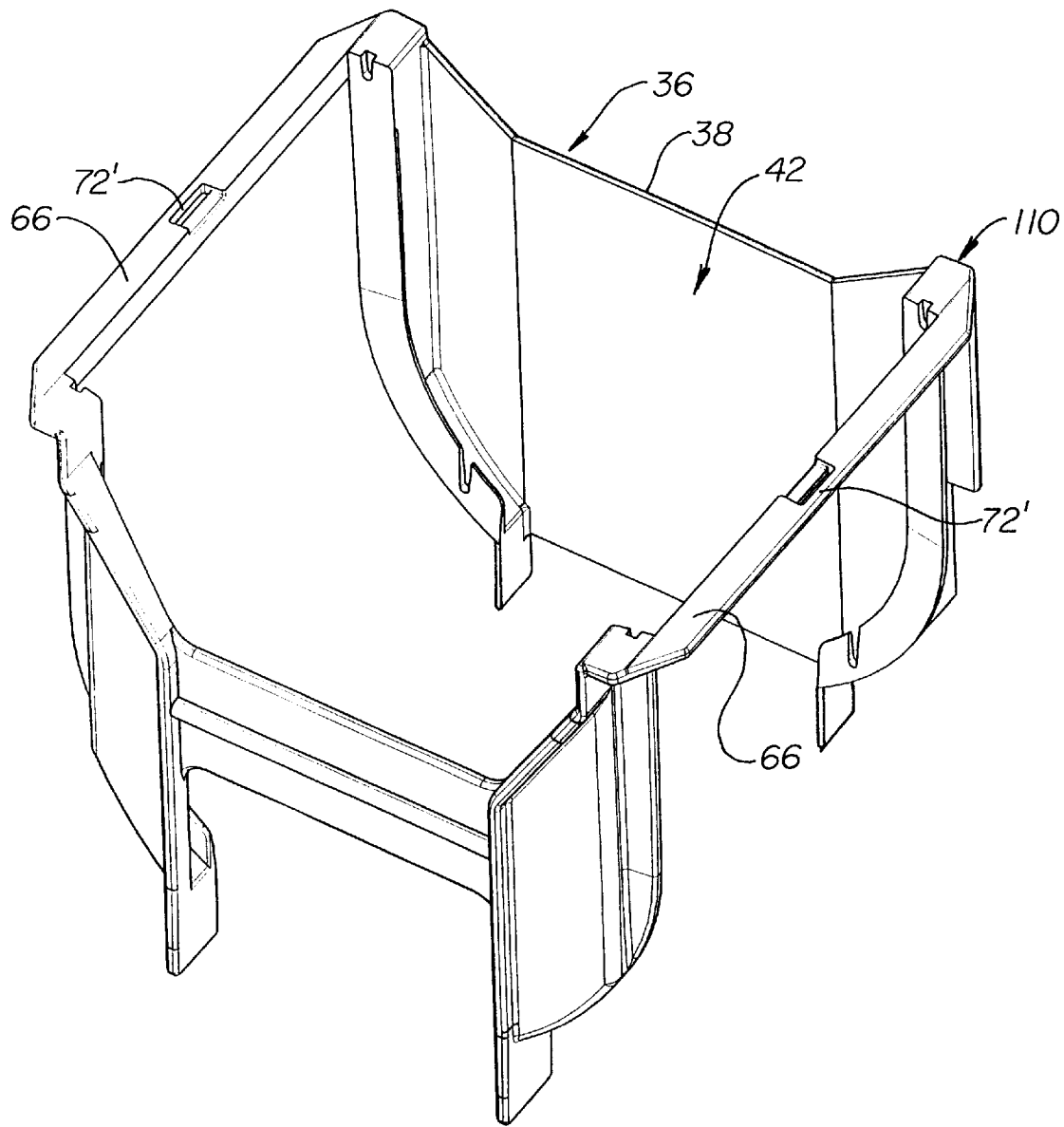
FIG. 22 is a perspective view of an alternative framework.
Figure 23:
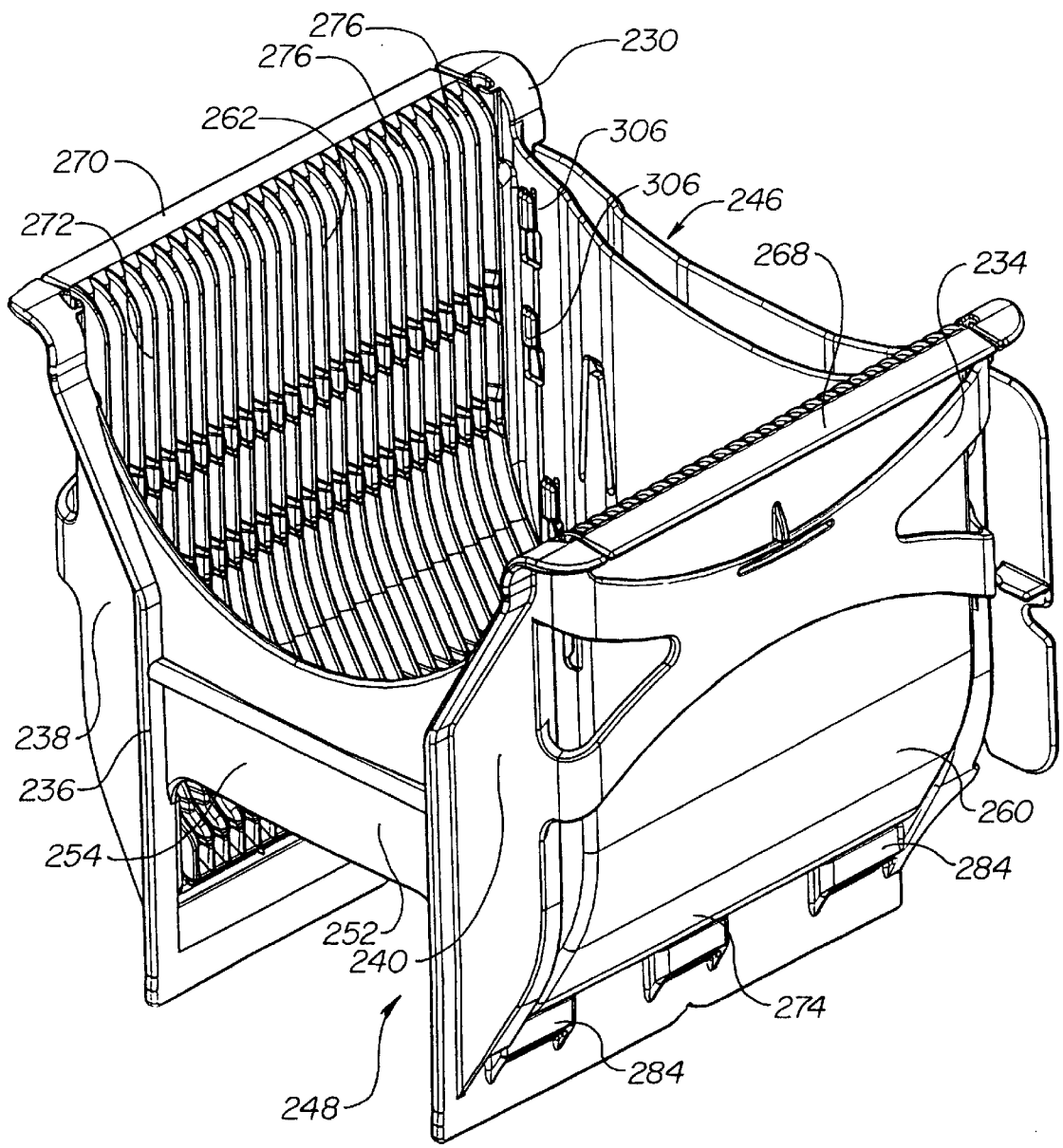
FIG. 23 is a perspective view of an additional embodiment.

Sidewall inserts 122 are positioned between front end member 118 and back end member 120 and have similar features as those found in sidewall inserts 41 with the addition of front end portion 136, back end portion 138, and cooperating upright coupling panels 140 as shown in FIG. 21. FIG. 22 shows one embodiment of sidewall insert 122, comprising upper solid planar section 104 and lower solid curved section 106 to close off wash slots 93 and prevent fluid from flowing between inside 88 and outside 90. Front end portion 136 of each sidewall insert 122 is connected to the appropriate left front portion 124 or right front portion 126 of front end 118. Back end portion 138 of each sidewall insert 122 is connected to the appropriate left back portion 132 or right back portion 134 of back end 120.

The securing means 62 of FIGS. 18–21 utilize coupling panels 140 attached to left front portion 124, right front portion 126, left back portion 132, right back portion 134, and front and back portions of sidewall inserts 122. Referring to FIG. 18, coupling panels 140 could be connected together by rivets 141, isolated weldments 142, nuts and bolts 143, or similar fastening means. "Securing means" when used herein includes these and other traditional fasteners.

Referring to FIG. 1, and specifically the dotted lines, an alternative embodiment of the invention is illustrated which utilizes a universal framework comprised of the sidewalls 40 and back end member 36 and have the front end member 32 or the interface portion 34 insertable into the framework. The dotted line 150 of FIG. 1, indicate a suitable division between the front end 32 or interface portion 34 and the balance of the framework 152. In this embodiment various specified process equipment interfaces 48 can be accommodated simply by use of alternative separate molds for the front end 32 while maintaining the same sidewalls. Securing means as described above may be used to secure the front end member 32 or interface portions 34 into the carrier framework.

Referring to FIGS. 23–28 additional embodiments of the invention are shown. This wafer carrier generally designated with the numeral 230 has the added feature of spanning members 234 which extend from the front end member 236 at the left front portion 238 and the right front portion 240. This wafer carrier again has an open top 246, an open bottom 248, equipment interface 252 as part of the front end member, the equipment interface and H-bar 254 extending between the left front portion and the right front portion. The side walls 260, 262 are comprised of sidewall inserts 268, 270 each of which have an upper substantially vertical portion 272 and a lower converging portion 274. A plurality of vertical slots 276 extend vertically downward for supporting and constraining the wafers.

The sidewall inserts 268, 270 each have pair of downwardly extending tabs 280 which engage into recesses 282 as part of pairs of cooperating engagement portions 284. The sidewall inserts 268, 270 also have vertical upright tabs 288 which slide into an engage with slots or recesses 290 in the framework. The sidewall inserts may be locked into place by appropriately positioned detents 292 such as shown on the tabs 280.

This embodiment of the wafer carrier includes an additional machine interface or flange 300 which attaches to the back end member 302. Again this connection is made by way of pairs of cooperating engagement portions 306. Such cooperating engagement portions may be configured as tabs 308 which extend into recesses or slots 310 on the back end member 302. Spring loaded locking tabs 314 which include a detent 316 may be utilized to lock the second equipment interface 300 in place. Said detents 316 engage in recesses 320 formed by protruding structures 322 on the second equipment interface 300.

Figure 26:
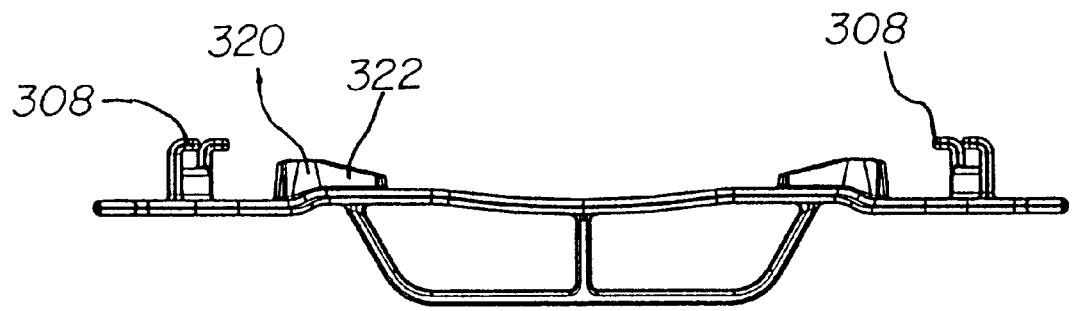
FIG. 26 is a rear elevational view of a flange or equipment interface suitable for attachment to the wafer carriers of FIGS. 23 and 24.
Figure 27:
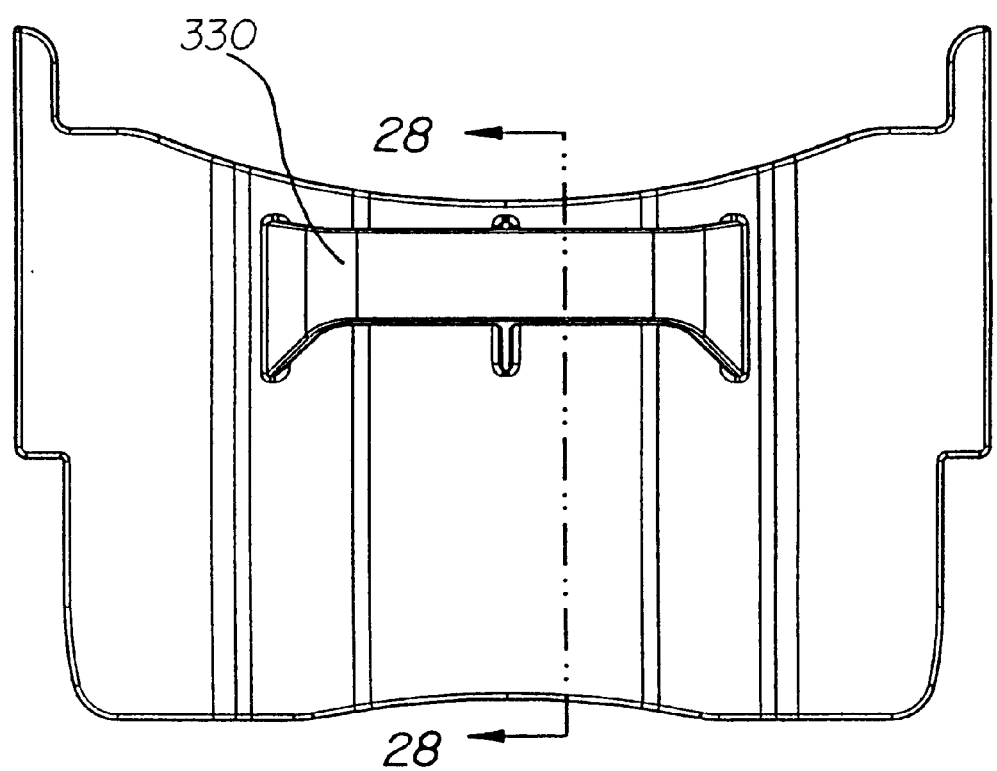
FIG. 27 is a top plan view of the flange or machine interface of FIG. 26.

Referring to FIGS. 26, 27, and 28 an additional embodiment of a flange 300 is shown including a handle 330. Such a handle may facilitate manual pickup of the wafer carrier or more appropriately is utilized as a robotic pickup handle.

The embodiments of FIGS. 23–28 allow the sidewall inserts to be positioned in nesting slots 334 and with said insertion adds significant additional rigidity to a carrier framework that is already substantially rigid due to the multiple spanning structures.

Note that the utilization of separately formed members allows uses of carbon fiber filler in varying the amounts to provide varying levels of static dissapative characteristics as desired for each specific independently formed component. For example, the machine interfaces may have higher conductive capabilities to discharge any charge on the carrier as opposed to the sidewall which have a lesser conductive characteristic minimize the potential of electrostatic discharges in the vicinity of the wafers. The carbon filler may be carbon fiber filler, or carbon powder.

The cooperating engagement portions utilized herein, in several of the embodiments provide securing means without external fasteners. This facilitates assembly and minimizes contact between two surfaces other than by point contact or line contact and allows the assembly to be snapped together. This particular configuration thus is conducive to cleaning and drying the assembled wafer carrier.

Although the figures show H-bar machine interfaces and robotic handles other machine interfaces such as the conventional kinematic couplings utilizing three grooves angularly spaced or any other suitable equipment interfaces.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed is:

1. An H-bar wafer carrier for engaging with equipment and for carrying a plurality of axially aligned circular wafers with the axis of the wafers extending substantially horizontally, the aligned wafer carrier having an open top and an open bottom and comprising:

an H-bar upright front end member having a left front portion, a right portion and a first equipment interface, the first equipment interface configured such that the carrier can be rotated forwardly to bear the equipment interface on equipment and position the axis of the aligned wafers in a substantially vertical orientation;

a pair of oppositely positioned sidewall members extending rearwardly from the front end member, one from left front portion and one from the right portion, each sidewall having a substantially vertical upper portion, a lower converging portion extending inwardly toward the opposite sidewall member, and a plurality of teeth extending from the upper portion to the lower portion defining slots for supporting and restraining the wafers the plurality of teeth and slots substantially vertical on the upper portions and converging inwardly on the lower converging portion;

an upright back end member having a panel and extending intermediate the two sidewalls; and at least one of the upright front end member, the pair of sidewall members, and the back end member formed separately from the balance of the wafer carrier and assembled into said wafer carrier and secured therein by a pair of locking cooperating engagement portion wherein the separately formed member is injection molded and is comprised of plastic and at least one of the other of the upright front end member, the pair of sidewall members, and the back end member of the wafer carrier is formed of a different plastic.

2. The wafer carrier of claim 1 wherein the sidewall members are sidewall inserts and the wafer carrier further comprises a pair of spanning members extending from the left front portion and the right front portion of the front end member to the back end member, each spanning member extending along a respective sidewall insert.

3. The wafer carrier of claim 2 wherein each sidewall insert has one of a pair of cooperating engagement portions and each respective spanning member has the other of the cooperating engagement portions, each pair of cooperating engagement portions securable together without fasteners that are non-integral with respect to the spanning member or the sidewall insert.

4. The wafer carrier of claim 1 further comprising a second equipment interface separate from and spaced from the back end member whereby the wafer carrier can be rotated rearwardly such that the second equipment interface bears upon equipment.

5. The wafer carrier of claim 1 further comprising a second machine interface separate from and spaced from the back end member which has one of a pair of cooperating engagement members on the second machine interface and the other of the cooperating engagement members is on the back end member.

6. The wafer carrier of claim 5 wherein the machine interface is a robotic lifting flange.

7. The wafer carrier of claim 1, wherein the separately formed member is further comprised of carbon filler with a static dissapative characteristic and wherein said static dissapative characteristic is different from the static dissapative characteristic of at least one of the other members of the wafer carrier.

8. A wafer carrier for engaging with equipment and for carrying a plurality of axially aligned circular wafers with the axis of the wafers extending substantially horizontally, the aligned wafer carrier having an open top and an open bottom and comprising:

an upright front end member having a left front portion, a right front portion and a first equipment interface, the first equipment interface configured such that the carrier can be rotated forwardly to bear the equipment interface on equipment and position the axis of the aligned wafers in a substantially vertical orientation;

a pair of sidewall members extending rearwardly from the front end member, one from left front portion and one from the right front portion, each sidewall having a substantially vertical upper portion, a lower converging portion, and a plurality of substantially vertical slots extending from the upper portion to the lower portion for supporting and restraining the wafers;

an upright back end member having a panel and extending intermediate the two sidewalls; and at least one of the upright front end member, the pair of sidewall members, and the back end member formed separately from the balance of the wafer carrier and assembled into said wafer carrier by a pair of locking cooperating engagement portions whereby said at least one member is secured therein without fasteners that are non-integral with the members secured; and wherein the separately formed member is injection molded and is comprised of plastic and a carbon filler whereby a static dissapative characteristic is provided and wherein said static dissapative characteristic is different from a static dissapative characteristic of at least one of the other members of the wafer carrier.

9. A wafer carrier for supporting a plurality of axially aligned substantially circular wafers with the axis of the wafers extending substantially horizontally, the wafer carrier having an open top and an open bottom and comprising:

an upright front end member having a first equipment interface configured such that the carrier can be rotated forwardly to bear upon the equipment interface and position the axis of the wafers in a substantially vertical orientation, a left front portion, and a right front portion;

an upright back end member displaced from and generally parallel to the upright front end member;

a pair of spanning members extending from the left front portion and the right front portion of the front end member to the rear end member, the front end member, the spanning members and the back end member all integrally formed and defining a carrier framework; and a pair of sidewall inserts each insertable adjacent a spanning member whereby each sidewall insert extends rearwardly from the front end member, one from the left front portion and one from the right front portion, each sidewall insert having a substantially vertical upper portion, a lower converging portion, and a plurality of substantially vertical slots extending from the upper portion to the lower portion for supporting and restraining the wafers.

10. A wafer carrier for interfacing with equipment and for carrying a plurality of axially aligned substantially circular wafers with the axis of the wafers extending substantially horizontally, the wafer carrier having an open top and an open bottom and comprising:

an upright front end member having a first equipment interface configured such that the carrier can be rotated forwardly to bear upon the equipment interface and position the axis of the wafers in a substantially vertical orientation, a left front portion, and a right front portion;

a pair of sidewall members extending rearwardly from the front end member, one from left front portion and one from the right front portion, each sidewall member having a substantially vertical upper portion, a lower converging portion, and a plurality of substantially vertical slots extending from the upper portion to the lower portion for supporting and restraining the wafers;

an upright back end member having a panel and extending intermediate the two sidewalls; and a second machine interface formed separately from the balance of the wafer carrier and assembled into said wafer carrier at the upright back end member and secured to the wafer carrier by a pair of locking cooperating engagement portions.

11. The wafer carrier of claim 10, wherein each of the pair of sidewall members are assembled into the wafer carrier.

12. The wafer carrier of claim 10, wherein the second machine interface is configured such that the carrier can be rotated rearwardly to bear upon the second equipment interface and position the axis of the wafers in a vertical orientation whereby the wafers are inverted from their position when the carrier is bearing upon the first equipment interface.

13. A wafer carrier for interfacing with equipment and for carrying a plurality of axially aligned substantially circular wafers with the axis of the wafers extending substantially horizontally, the wafer carrier having a front end H-bar first equipment interface configured such that the carrier can be rotated forwardly to bear upon said first equipment interface and position the wafers axis substantially vertical, a pair of sidewalls each with substantially vertical upper portion and a lower converging portion and a plurality of slots for holding the wafers, a back end member, and a second machine interface spaced from said back end member, the second machine interface configured such that the carrier can be rotated rearwardly to bear upon said machine interface and to orient the wafers in an inverted position from when the carrier bears upon the front end H-bar first equipment interface.

14. The wafer carrier of claim 13, wherein the second machine interface is assembleable onto the carrier by a pair of locking cooperative engagement portions whereby the second machine interface is secured to the wafer carrier without fasteners non-integral with and separable from the second machine interface and the back end member.

15. A wafer carrier for holding circular semiconductor wafers having an edge portion, the carrier comprising:

a carrier framework comprising:

a front end member having an equipment interface portion intermediate a left front portion and a right front portion, said left and right front portions each having an upper portion and a lower portion;

a back end member opposite said front end, said back end having a panel intermediate a left back portion and a right back portion, said left and right back portions each having an upper portion and a lower portion;

a first sidewall support having a front end and a back end, said front end connected to and integral with said left front portion and said back end connected to and integral with said left back portion; and a second sidewall support having a front end and a back end, said front end connected to and integral with said right front side and said back end connected to and integral with said right back side whereby the front end, the back end, and the first and second sidewall supports form an integral framework; and a first and a second sidewalls inserts separately formed from said carrier framework and having slots for restraining said wafer edge portions, the sidewall inserts positioned intermediate said front and back end members, spanning along the respective side members, each sidewall insert lockingly engaged with the carrier framework by way of a pair of cooperative engagement portions with one engagement portion of each pair positioned on a sidewall insert and the engagement portion cooperative thereto positioned on the framework portion and wherein said at least one of each of said pairs of cooperative engagement portions is comprised of a recess and the cooperative engagement portion thereto is comprised of a locking tab.

16. A wafer carrier for engaging with equipment and for carrying a plurality of axially aligned circular wafers with the axis of the wafers extending substantially horizontally, the aligned wafer carrier having an open top and an open bottom and comprising:

an upright front end member having a left front portion, a right front portion and a first equipment interface, the first equipment interface configured such that the carrier can be rotated forwardly to bear the equipment interface on equipment and position the axis of the aligned wafers in a substantially vertical orientation;

a pair of sidewall inserts extending rearwardly from the front end member, one from left front portion and one from the right front portion, each sidewall having a substantially vertical upper portion, a lower converging portion, and a plurality of substantially vertical slots extending from the upper portion to the lower portion for supporting and restraining the wafers;

an upright back end member having a panel and extending intermediate the two sidewalls;

at least one of the upright front end member, the pair of sidewall inserts, and the back end member formed separately from the balance of the wafer carrier and assembled into said wafer carrier by a pair of locking cooperating engagement portions whereby said at least one member is secured therein without external fasteners; and a second machine interface which has one of a pair of cooperating engagement members on the second machine interface and the other of the cooperating engagement members on the back end member; and the sidewall inserts comprising a plurality of cooperating snap-in locking tabs on each of said sidewall inserts and a plurality of cooperating recesses configured for insertion of said snap-in locking tabs on the framework.

17. A wafer carrier for engaging with equipment and for carrying a plurality of axially aligned circular wafers with the axis of the wafers extending substantially horizontally, the aligned wafer carrier having an open top and an open bottom and comprising:

an upright front end member having a left front portion, a right front portion and a first equipment interface, the first equipment interface configured such that the carrier can be rotated forwardly to bear the equipment interface on equipment and position the axis of the aligned wafers in a substantially vertical orientation;

a pair of sidewall inserts extending rearwardly from the front end member, one from left front portion and one from the right front portion, each sidewall having a substantially vertical upper portion, a lower converging portion, and a plurality of substantially vertical slots extending from the upper portion to the lower portion for supporting and restraining the wafers;

an upright back end member having a panel and extending intermediate the two sidewalls inserts;

at least one of the upright front end member, the pair of sidewall inserts, and the back end member formed separately from the balance of the wafer carrier and assembled into said wafer carrier by a pair of locking cooperating engagement portions whereby said at least one member is secured therein without external fasteners; and a robotic lifting flange which has one of a pair of cooperating engagement members on the robotic lifting flange and the other of the cooperating engagement members on the back end member;

the sidewall inserts comprising a plurality of nubs extending from each of the sidewall inserts and a plurality of cooperating recesses in each of the first and second upper sidewall supports for receiving said nubs.

18. A wafer carrier for holding circular semiconductor wafers having a circular edge portion, the carrier having an open top and open bottom and comprising:

a front end member having a H-bar equipment interface portion intermediate a left front portion and a right front portion;

a back end member having a panel opposite said front end and intermediate a left back portion and a right back portion; and first and second sidewall inserts separately formed from said front and back end members, the sidewall inserts having a front end portion, a back end portion, a curved lower portion corresponding to the circular edge portion of the wafers and slots for restraining said edge portion, the sidewall inserts intermediate the front end member and the back end member and lockingly engaged thereto without fasteners separable from the sidewall inserts or front and back end members.

* * * * *